United States Patent [19]

Bruch et al.

[11] 4,305,761
[45] Dec. 15, 1981

[54] NI-BASE EUTECTIC ALLOY ARTICLE AND HEAT TREATMENT

[75] Inventors: Charles A. Bruch; Wendy H. Murphy, both of Cincinnati, Ohio

[73] Assignee: General Electric Company, Cincinnati, Ohio

[21] Appl. No.: 121,627

[22] Filed: Feb. 14, 1980

[51] Int. Cl.³ .............................................. C22F 1/10
[52] U.S. Cl. .................................... 148/3; 148/13.1; 148/20.3; 148/32.5; 148/127; 148/162
[58] Field of Search ................... 148/162, 32.5, 32, 3, 148/13.1, 20.3, 127

[56] References Cited

U.S. PATENT DOCUMENTS 4,116,723  9/1978  Gell et al. ......................... 148/32.5

Primary Examiner—R. Dean
Attorney, Agent, or Firm—Lee H. Sachs; Derek P. Lawrence

[57] ABSTRACT

An improved columnar grained, polycrystalline, anisotropic article is provided of a Ni-base, carbide fiber reinforced eutectic alloy by a method of providing a unidirectionally solidified cast body which includes such fibers aligned and embedded in a gamma-gamma prime structure. Such body is heated at a first temperature to fully solution the gamma-gamma prime without melting the carbide fibers; exposed to a second, lower, temperature to precipitate fine gamma prime in substantially cuboidal shape within the size range of 1–4 microns; and exposed to a third, still lower, temperature to perfect such cuboidal structure without refinement or coarsening. The resultant article is characterized by improved longitudinal stress rupture life.

8 Claims, 6 Drawing Figures

4,305,761

NI-BASE EUTECTIC ALLOY ARTICLE AND HEAT TREATMENT

FIELD OF THE INVENTION

This invention relates to eutectic superalloy articles and, more particularly, to a heat treatment method for Ni-base, predominantly MC, carbide fiber reinforced, anisotropic eutectic superalloy articles and the resultant article.

BACKGROUND OF THE INVENTION

In the development of alloys for use in gas turbine engines, there has evolved a type of alloy sometimes referred to as fiber reinforced composite eutectic alloys. Such alloys are characterized by a metal carbide reinforcing fibrous phase embedded in the alloy matrix generally along a longitudinal axis of the article which follows generally the direction of solidification of the alloy or article made from such an alloy. As a result, the alloy is characterized by having anisotropic properties. One such alloy form is described in U.S. Pat. No. 3,904,402—Smashey, assigned to the assignee of the present invention. The disclosure of that patent is incorporated herein by reference.

Although strength characteristics of such an alloy are improved over other nickel or cobalt base superalloys, it has been recognized that variations in microstructure can occur from various heat treatments, some of which can be detrimental.

SUMMARY OF THE INVENTION

It is a principal object of the present invention to provide an improved heat treatment for Ni-base carbide reinforced eutectic superalloy articles which result in improved stress rupture properties at elevated temperatures.

Another object is to provide an improved columnar grained, polycrystalline, anisotropic article of such a Ni-base superalloy having improved longitudinal stress rupture properties and structure.

These and other objects and advantages of the present invention will be more fully understood from the following detailed description, the drawing and the specific examples all of which are intended to be typical of rather than in any way limiting on the scope of the present invention.

Briefly, one form of the method associated with the present invention comprises providing a unidirectionally solidified anisotropic metallic composite body which includes aligned eutectic reinforcing metallic carbide fibers embedded in a gamma-gamma prime structure in which the gamma prime is dispersed in the gamma phase. Such a body is heated in a non-oxidizing atmosphere at a first temperature above the gamma prime solvus temperature, for a time sufficient to fully solution the gamma prime in the gamma phase but insufficient to melt the carbide fibers. Thereafter, the body is exposed to a second temperature, lower than the first temperature, during which fine gamma prime phase is precipitated. Such second temperature is below that at which substantial resolutioning and coarsening or refinement of the gamma prime occurs to provide the gamma prime in a substantially cuboidal shape in the size range of about 1-4 microns and preferably 1-2 microns. The body is then additionally exposed or heated at a third temperature lower than the second temperature for a time which perfects the cuboidal gamma prime morphology but which avoids substantial solutioning of the gamma prime and refinement or coarsening of the gamma prime structure. Then the body is cooled below the third temperature.

In a preferred form of the method, at least one of the heating steps is conducted concurrently with such fabrication operations as brazing or such coating operations as diffusion coating.

The article associated with the present invention is an improved columnar grained, polycrystalline, anisotropic article of a Ni-base, carbide fiber reinforced eutectic alloy, the article comprising a substantially cuboidal gamma prime morphology in the size range of about 1-4 microns within the columnar grains. The carbide fibers are aligned generally along the columnar direction of the grains.

DESCRIPTION OF THE PREFERRED EMBODIMENTS

Figure 1:
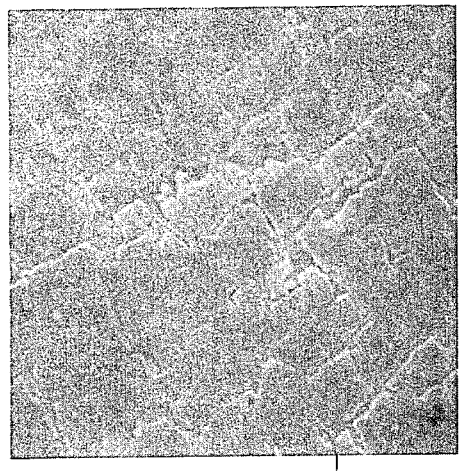
FIG. 1 is a Scanning Electron Microscope (SEM) photomicrograph at about 5600 magnifications of the transverse microstructure of alloy 4 in the as-cast directionally solidified condition.

During the evaluation of the present invention, a variety of eutectic alloys within the scope of those described in the above-identified U.S. Pat. No. 3,904,402, were prepared and tested. The composition typical of such alloys are shown in the following Table I.

TABLE I

| Alloy No. | Nominal Composition (wt. %) Balance Ni and incidental impurities | | | | | | | | | |
|---|---|---|---|---|---|---|---|---|---|---|
| | Co | Cr | Al | V | Re | Ta | C | B | W | Mo |
| 1 | 3.3 | 4.4 | 5.4 | 5.6 | 6.2 | 8.1 | 0.48 | | | |
| 2 | 3.8 | 3.8 | 5.3 | | 6.4 | 11.4 | 0.43 | .01 | 4.3 | 3.0 |
| 3 | 11.9 | 1.9 | 6.5 | 4.1 | 6.3 | 10.4 | 0.36 | | | |
| 4 | 3.8 | 1.9 | 6.5 | 3.9 | 6.3 | 8.0 | 0.24 | | | |

One of the important characteristics of the method associated with the present invention is that the gamma-gamma prime microstructure be fully solutioned without melting the carbide reinforcing fibers. This aspect of the present invention is particularly useful in connection with cast article manufacture which includes high temperature brazing or high temperature coating or both. Such processing or fabricating steps generally are carried out at temperatures approaching that of the gamma prime solvus or at which gamma prime coarsening or solutioning occurs. Therefore, one important feature of the method associated with the present invention is the heating at a first temperature above the alloy gamma prime solvus temperature, for a time at such temperature to fully solution the gamma-gamma prime microstructure without melting the carbide fibers.

Because of the importance of the present invention in the manufacture of articles requiring processing such as brazing or coating or both, a variety of heat treatments were evaluated. Because the article associated with the present invention is cast using a directional solidification method, sometimes referred to as planar front solidification, the eutectic alloy has no dendrites. Instead, there are generated elongated reinforcing fibers of a metallic carbide (MC or monocarbide) in which the metal preferably is principally Ta but can include, in addition, such metals as Mo, W, V and Cb, as may be included in the alloy. Therefore, the gamma prime solvus temperature for such eutectic alloy generally lies in the range of 2200°–2450° F. Above about 2450° F., there is a tendency for the metallic carbides to melt.

During the evaluation of the present invention, a variety of heat treatments were studied. One purpose was to determine the effect of partial or fully solutioning of the gamma-gamma prime microstructure as well as the effect of intermediate thermal processing which generally coincides with such processing as high temperature brazing or coating or both. Representative of such heat treatments studied are those listed in the following Table II.

TABLE II

| NiTaC EUTECTIC ALLOY HEAT TREATMENTS | |
|---|---|
| H.T. Example | Heat Treatmemts |
| I | 2200° F./½ hr/Vac + HeQ→RT |
| | + 2000° F./4 hr/Vac + Vac Cool→1200° F. |
| | + HeQ→RT |
| | + 1975° F./2 hr/Vac + Vac Cool→1200°F. |
| | + HeQ→Rt |
| | + 1975° F./4 hr/Vac + Vac Cool→RT |
| II | HT I |
| | + 1650° F./16 hr/Vac + Any Cool→RT |
| III | 2425° F./2 hr/Vac + HeQ→RT |
| | + HT II |
| IV | 2350° F./2 hr/Vac + HeQ→RT |
| | + HT II |
| A | 2310° F./2 hr/Vac + HeQ |
| | + 1975° F./15 hr/Vac + HeQ |
| | + 1650° F./16 hr/Vac + Any Cooling |
| B | 2310° F./2 hr/Vac + HeQ |
| | + 2200° F./½ hr/Vac + HeQ |
| | + 1975° F./15 hr/Vac + HeQ |
| | + 1650° F./16 hr/Vac + Any Cooling |

As used in Table II, "H.T." means "heat treatment", "Vac." means "vacuum", "HeQ" means "helium quench", and "RT" means "room temperature". In Table II, the heat treatments designated by I through IV, were used in the evaluation of alloy 4 and heat treatments A and B were used in the evaluation of alloy 2, the compositions of which are identified in Table I. The heat treatments shown in Table II are examples of the method associated with the present invention and can be modified or simplified within the scope of the invention for a particular alloy or article being treated. In addition, a variety of cooling means and intermediate cooling temperatures can be used depending on the manufacturing procedures being conducted. For example, furnace cooling to or below the next successive lower temperature were evaluated in the present invention, with beneficial results.

It had been determined for alloy 2 that after two hours at 2275° F., the gamma prime was not fully solutioned, whereas at 2300° F. for two hours all of the gamma prime was solutioned. Therefore, the temperature of 2310° F. was selected for a solutioning or first temperature. In a similar preliminary determination, specimens of alloy 4 were heated to various temperatures and held for two hours after which they were water quenched. Microscopic examination of such alloy 4 specimens showed that solutioning of the gamma prime was incomplete after two hours at 2400° F., whereas all of the gamma prime was solutioned in two hours at 2425° F. with no visible effect on the carbide fiber morphology. Therefore, the first or solutioning temperature of 2425° F. for two hours was selected for alloy 4. Further studies disclosed that if alloy 4 subsequently was held at 2200° F. for about an hour or more, undesirable resolutioning and growth of the gamma prime occurred. This occurrence has significance in connection with subsequently applied fabrication processing such as brazing or subsequent high temperature coating operations. Accordingly, another feature of the method associated with the present invention is a second or additional heating of the article body in a second temperature range less than the first temperature to precipitate fine gamma prime phase. Subsequently, the body is heated at a third temperature less than the second temperature for a time which perfects the cuboidal gamma prime but which avoids substantial solutioning of the gamma prime and refinement or coarsening of the gamma prime structure which can be observed upon cooling.

Figure 2:
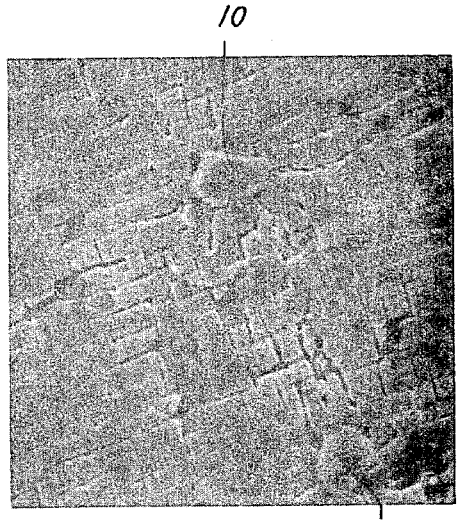
FIG. 2 is a SEM transverse microstructure photomicrograph at about 5600 magnifications of alloy 4 after heat treatment III.
Figure 3:
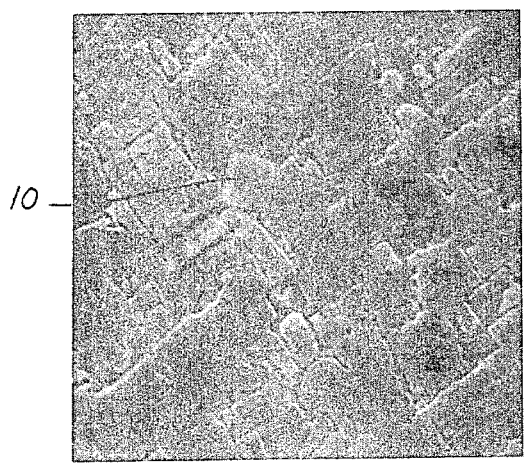
FIG. 3 is a SEM transverse microstructure photomicrograph at about 5600 magnifications of alloy 4 after heat treatment IV.

With reference to the drawing, all of the photomicrographs presented were taken at a magnification of about 5600X through use of a Scanning Electron Microscope (SEM) and are of the transverse microstructure of alloys evaluated in connection with the present invention. FIG. 1 presents the as-directionally solidified (as-DS) cast structure for alloy 4. A transverse section of a TaC reinforcing fiber is identified in the figures of the drawing at 10. The photomicrograph of FIG. 2 shows transverse microstructure typical of that generated by heat treatment III. FIG. 3 shows transverse microstructure typical of that generated in heat treatment IV. It can be observed in FIG. 3 that the gamma-gamma prime microstructure was not fully solutioned.

As was mentioned before, the gamma prime solvus temperature for alloy 4 was found to be about 2400° F. Therefore, with reference to Table II, it can be recognized that heat treatments I, II and IV did not achieve full solutioning. By way of contrast, heat treatment III achieved such full solutioning and resulted in the improved cuboidal microstructure shown in FIG. 2.

Figure 4:
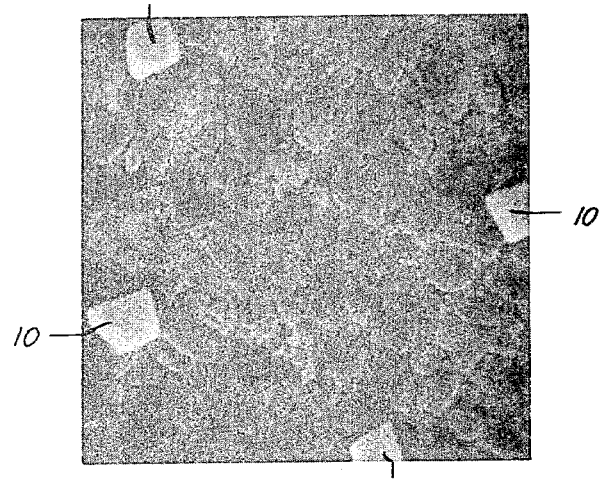
FIG. 4 is a SEM photomicrograph at about 5600 magnifications of the transverse microstructure of alloy 2 in the as-cast directionally solidified condition.
Figure 5:
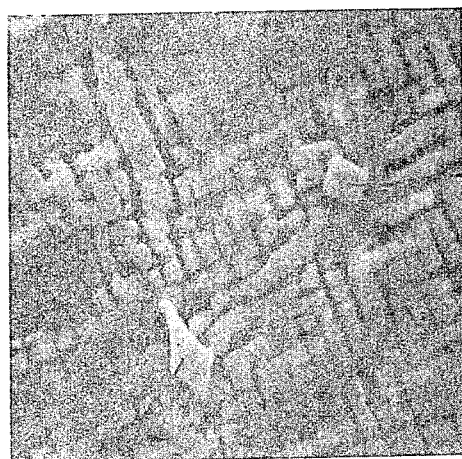
FIG. 5 is a SEM transverse microstructure photomicrograph at about 5600 magnifications of alloy 2 after heat treatment A.
Figure 6:
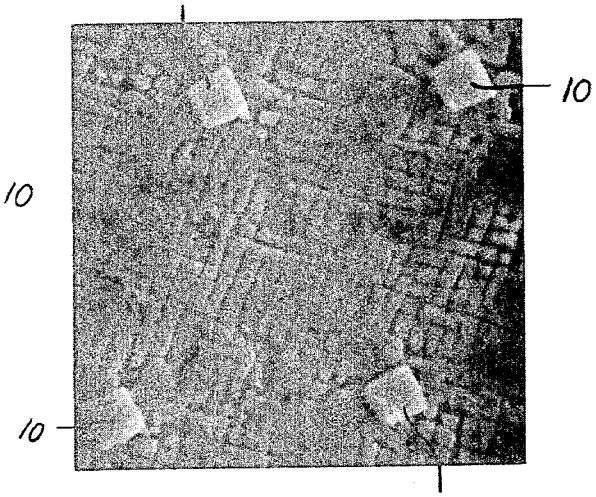
FIG. 6 is a SEM transverse microstructure photomicrograph at about 5600 magnifications of alloy 2 after heat treatment B.

FIG. 4 shows the transverse microstructure of alloy 2 in the as-cast directionally solidified condition, similar to that shown in FIG. 1. FIGS. 5 and 6 present the transverse microstructure of alloy 2 after heat treatments A and B, respectively, each of which results in improved properties. However, as will be seen from the data of Table III, heat treatment A provides a more significant improvement in longitudinal stress rupture life. Each of heat treatments A and B included full solutioning of the gamma-gamma prime microstructure.

Longitudinal stress rupture data for alloys 2 and 4 under various material conditions are shown in Table III.

TABLE III

| | | Longitudinal Stress Rupture Data | | | |
|---|---|---|---|---|---|
| | Material | 1700° F./70 ksi/air | | 1980° F./30 ksi/air | |
| Alloy | Condition | Life (hrs) | $P_{LM}$ | Life (hrs) | $P_{LM}$ |
| | | (C = 15) | | (C = 15) | |
| 4 | As-DS | 24.0 | 35.4 | 32.5 | 40.3 |
| | H.T. I | 27.3 | 35.5 | 15.9 | 39.5 |
| | H.T. II | 27.1 | 35.5 | 27.0 | 40.1 |
| | H.T. III | 65.9 | 36.3 | 86.3 | 41.3 |
| | H.T. IV | 50.6 | 36.1 | 52.8 | 40.8 |
| | | (C = 20) | | (C = 20) | |
| 2 | As-DS | 8.0 | 45.2 | 50.5 | 53.0 |
| | H.T. A | 81.7 | 47.3 | 122.6 | 53.9 |
| | H.T. B | 58.5 | 47.0 | 100.0 | 53.7 |

With reference to the data for alloy 4, it is clearly shown that after fully solutioning of the gamma-gamma prime microstructure in heat treatment III, significant improvement in longitudinal stress rupture life is attained. As used in Table III, "ksi" means thousands of pounds per square inch and "$P_{LM}$" means the well-known and widely used metallurgical stress rupture relationship known as the Larson-Miller Parameter $P_{LM} = T(C \log t) \times 10^{-3}$, described in more detail in American Society of Engineers Transactions, 1952, Volume 74, at pages 765-771. Use of such a parameter allows a wide variety of comparisons between stress rupture lives at various temperatures and at selected stress levels. It is presented in Table III, with the C values, to facilitate such comparison.

With reference to alloy 2 in Table III, the improvements of heat treatments A and B can be seen, with the improvement of heat treatment A being preferred.

As was mentioned before, portions of the heat treatment associated with the present invention can be conducted concurrently with such fabrication operations as brazing or with high temperature coating operations such as diffusion aluminiding, or both. For example, in the heat treatment for alloy 4, the heating to a first temperature to fully solution the gamma-gamma prime microstructure can be conducted concurrently with a brazing operation at a temperature of at least about 2425° F. Similarly, portions of the additional heating can be conducted concurrently with a coating operation such as diffusion coating for example at 1975° F.

Thus, the heat treatment associated with the present invention for nickel base, carbide reinforced eutectic alloy articles is capable of providing a substantially cuboidal microstructure which results in improved longitudinal stress rupture life while avoiding substantial solutioning of the gamma prime and refinement or coarsening of the gamma prime structure. With the alloys associated with the method of the present invention, as shown by the drawing, such cuboidal structure is in the size range of about 1-4 microns and preferably 1-2 microns. Although the present invention has been described in connection with specific examples and embodiments, it will be understood by those skilled in the art the variations and modifications of which the invention is capable within its broad scope.

What is claimed is:

1. A method for making an article of a Ni-base, carbide fiber reinforced eutectic alloy of improved strength properties comprising:
   providing a unidirectionally solidified, anisotropic metallic composite cast body including aligned eutectic reinforcing metallic carbide fibers embedded in a gamma-gamma prime structure in which the gamma prime is dispersed in a gamma phase;
   heating the body in a non-oxidizing atmosphere at a first temperature above the gamma prime solvus temperature for a time sufficient to fully solution the gamma-prime in the gamma phase but insufficient to melt the carbide fibers;
   conducting high temperature diffusion coating on a surface of the body including exposing the body to a second temperature lower than the first temperature and below that at which substantial resolutioning and coarsening or refinement of the gamma prime occurs to precipitate a fine gamma prime phase and to provide the gamma prime in a substantially cuboidal shape in the size range of about 1-4 microns;
   additionally exposing the body to a third temperature lower than the second temperature for a time which perfects the cuboidal gamma prime but which avoids substantial solutioning of the gamma prime and refinement or coarsening of the gamma prime structure; and then,
   cooling the body below the third temperature to provide improved longitudinal stress rupture properties.

2. The method of claim 1 in which the heating of the body to fully solution the gamma prime microstructure at the first temperature is conducted in the temperature range of about 2200-2450° F. concurrently while brazing at least one additional component to the body.

3. A method for fabricating an article from a plurality of components comprising:
   providing as a first component of the article a unidirectionally solidified, anisotropic metallic composite cast body including aligned eutectic reinforcing metallic carbide fibers embedded in a gamma-gamma prime structure in which the gamma prime is disbursed in a gamma phase;
   heating the body in a non-oxidizing atmosphere at a first temperature above the gamma prime solvus temperature for a time sufficient to fully solution the gamma prime in the gamma phase but insufficient to melt the carbide fibers while brazing at least one additional component to the body;
   exposing the body to a second temperature lower than the first temperature and below that at which substantial resolutioning and coarsening or refinement of the gamma prime occurs to precipitate a fine gamma prime phase and to provide the gamma prime in a substantially cuboidal shape in the size range of about 1-4 microns;
   additionally exposing the body to a third temperature lower than the second temperature for a time which perfects the cuboidal gamma prime but which avoids substantial solutioning of the gamma prime and refinement or coarsening of the gamma prime structure; and then,
   cooling the body below the third temperature to provide improved longitudinal stress rupture properties.

4. The method of claim 3 in which:
   the fabricated article including the body is additionally exposed to the second temperature while conducting high temperature diffusion coating on a surface of the article.

5. An improved columnar grained, polycrystalline, carbide fiber reinforced, anisotropic article of a Ni-base, eutectic alloy which includes C and Ta for carbide fiber formation, the alloy including within its composition, by weight, about 0.25–1% C. and 3–15% Ta, the article comprising:
- a substantially cuboidal gamma prime morphology within the columnar grains,
- the gamma prime being in the size range of 1–4 microns, and
- carbide fibers aligned generally along the direction of the columnar grains, and
- the article further characterized by improved longitudinal stress rupture life.

6. The article of claim 5 in which:
- the Ni-base alloy comprises Co, Cr, Al, Re, Ta and C and wherein the carbide fibers are predominantly TaC; and
- the cuboidal gamma prime is in the size range of 1–2 microns.

7. The article of claim 6 in which the Ni-base alloy consists essentially of Co, Cr, Al, Re, Ta, C, B, W and Mo, with the balance Ni and incidental impurities.

8. The article of claim 6 in which the Ni-base alloy consists essentially of Co, Cr, Al, V, Re, Ta and C, with the balance Ni and incidental impurities.

* * * * *